(12) United States Patent
Tamura

(10) Patent No.: US 7,075,384 B2
(45) Date of Patent: Jul. 11, 2006

(54) DELTA-SIGMA MODULATED FRACTIONAL-N PLL FREQUENCY SYNTHESIZER AND WIRELESS COMMUNICATION APPARATUS

(75) Inventor: Masahisa Tamura, Kanagawa (JP)

(73) Assignee: Sony Ericsson Mobile Communications, Japan, Inc., Tokyo (JP)

( * ) Notice: Subject to any disclaimer, the term of this patent is extended or adjusted under 35 U.S.C. 154(b) by 0 days.

(21) Appl. No.: 11/095,352

(22) Filed: Mar. 31, 2005

(65) Prior Publication Data
US 2005/0218996 A1 Oct. 6, 2005

(30) Foreign Application Priority Data
Apr. 1, 2004 (JP) .......................... P2004-109343

(51) Int. Cl.
*H03C 3/06* (2006.01)
(52) U.S. Cl. ....................... 332/127; 327/113
(58) Field of Classification Search ............... None
See application file for complete search history.

(56) References Cited

U.S. PATENT DOCUMENTS 6,008,704 A * 12/1999 Opsahl et al. ............. 332/127
6,600,378 B1 * 7/2003 Patana ........................ 331/1 A
6,703,878 B1 * 3/2004 Soumyanath et al. ....... 327/157
6,707,855 B1 * 3/2004 Patana ....................... 375/244
6,708,026 B1 * 3/2004 Klemmer et al. ........... 455/314
6,917,317 B1 * 7/2005 Nagaso et al. .............. 341/131
2004/0196924 A1* 10/2004 Wilson ....................... 375/302
2005/0271159 A1* 12/2005 Yoshikawa et al. ......... 375/295
2006/0014513 A1* 1/2006 Uozumi et al. ............. 455/323

FOREIGN PATENT DOCUMENTS

EP         1111793 A1 *  6/2001

* cited by examiner

*Primary Examiner*—Terry D. Cunningham
*Assistant Examiner*—Cassandra Cox
(74) *Attorney, Agent, or Firm*—Frommer Lawrence & Haug LLP; William S. Frommer

(57) ABSTRACT

Disclosed is a delta-sigma modulated fractional-N PLL frequency synthesizer which performs fractional-N by modulating a divider that divides output frequencies from a voltage controlled oscillator. Fractional part data F from a register is forwarded to a second adder. A first adder adds output from a delta-sigma modulator to output therefrom delayed and inverted by a delay inverter to generate an artificially random bit stream averaging zero. The second adder adds fractional part data F to output from the first adder to generate an artificially random data sequence averaging a value of fractional part data. The generated data sequence is forwarded to the delta-sigma modulator. An adder adds integral part data to output from the delta-sigma modulator. Added output is forwarded to the divider.

8 Claims, 8 Drawing Sheets

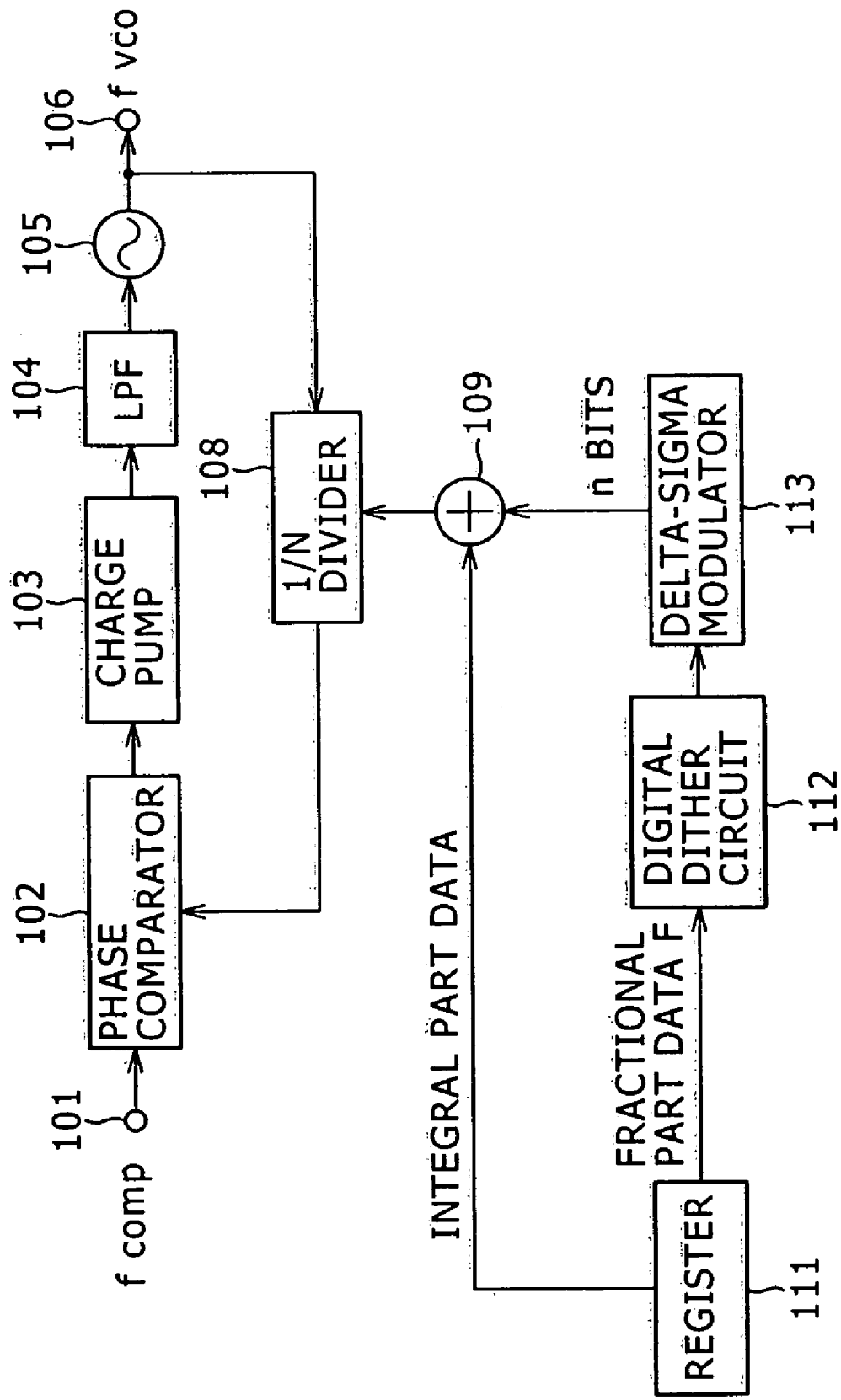

DELTA-SIGMA MODULATED FRACTIONAL-N PLL FREQUENCY SYNTHESIZER AND WIRELESS COMMUNICATION APPARATUS

CROSS REFERENCES TO RELATED APPLICATIONS

The present invention contains subject matter related to Japanese Patent Application JP 2004-109343 filed in the Japanese Patent Office on Apr. 1, 2004, the entire contents of which being incorporated herein by reference.

BACKGROUND OF THE INVENTION

1. Field of the Invention

The present invention relates to a delta-sigma modulated fractional-N PLL frequency synthesizer and a wireless communication apparatus having the same frequency synthesizer.

2. Description of Related Art

In the past, a delta-sigma modulator is constructed to integrate input signals and quantizes them using one or more bits. For example, the delta-sigma modulator is applied to A/D (analog/digital) converters, D/A (digital/analog) converters, PLL (Phase Locked Loop) circuits, and the like.

With respect to a transfer function of the delta-sigma modulator to a quantization noise, the transfer function is characterized to be small in a low frequency region and large in a high frequency region. That is, the delta-sigma modulator allows quantization noise components in an output signal to concentrate in the high frequency region. Accordingly, the delta-sigma modulator supplies output signals with noise components suppressed in a given band. Such effect of suppressing noise components is generally called "noise shaping".

In wireless communication apparatuses such as cellular phones, a frequency synthesizer including a PLL circuit is generally used as a local oscillator of a frequency converter (mixer).

An integer-N PLL circuit, which is an example of PLL circuits, receives a signal obtained by dividing a reference frequency signal from the reference oscillator and a signal obtained by dividing a frequency signal from a voltage controlled oscillator (VCO) at a phase comparator to implement phase-locked operation. Therefore, the oscillated frequency of VCO is an integral multiple of a comparison frequency input to the phase comparator. This means that the comparison frequency needs to be lowered as the wireless communication system requires smaller channel steps. On the other hand, decreasing the comparison frequency increases the time (lockup time) needed for channel switching. There is trade-off relationship between the comparison frequency and the lockup time.

The fractional-N PLL is known as a technology to solve this trade-off and enables operations at a channel step smaller than the comparison frequency. As one of techniques to realize the fractional-N PLL, there is known a technology using the delta-sigma modulator (i.e., a delta-sigma modulated fractional-N PLL frequency synthesizer).

FIG. 6 shows the schematic construction of a related delta-sigma modulated fractional-N PLL frequency synthesizer.

In FIG. 6, a terminal 101 is supplied with a signal having a phase comparison frequency fcomp that is generated by dividing a reference frequency signal from a reference oscillator (not shown). The phase comparison frequency fcomp signal is input to a phase comparator 102. The phase comparator 102 detects a phase difference between the phase comparison frequency fcomp signal supplied from the terminal 101 and a frequency signal generated from a divider 108 by dividing by N an output frequency from a subsequent voltage controlled oscillator (VCO) 105. The phase comparator 102 outputs a phase difference signal that represents the phase difference in binary. The phase difference signal output from the phase comparator 102 is supplied to a charge pump 103.

The charge pump 103 converts the binary phase difference signal from the phase comparator 102 into ternary. The charge pump 103 supplies or is supplied with currents corresponding to the three values to generate current signals proportional to the above-mentioned phase difference. An output current signal from the charge pump 103 is supplied to a low pass filter (LPF) 104.

The low pass filter 104 smoothes the output current signal from the charge pump 103 and converts it into a voltage signal. An output voltage signal from the low pass filter 104 is used for controlling a voltage controlled oscillator 105.

The voltage controlled oscillator 105 outputs a signal having oscillation frequency fvco in accordance with the output voltage signal from the low pass filter 104. The oscillation frequency fvco signal is provided to subsequent circuitry (such as a frequency converter) as an output signal from the delta-sigma modulated fractional-N PLL frequency synthesizer via a terminal 106. Further, the oscillation frequency fvco signal is divided by the divider 108 and is fed back to the phase comparator 102.

A register 111 stores data representing integral parts and fractional parts of the divided data. The register 111 supplies an adder 109 with integral part data including a plurality of bits to represent the integral part. The register 111 supplies a delta-sigma modulator 113 with fractional part data F including a plurality of bit store present the fractional part.

The delta-sigma modulator 113 integrates the supplied fractional part data F, quantizes it, and then outputs it to the adder 109.

The adder 109 adds the integral part data to output data from the delta-sigma modulator 113. The added data is supplied to the divider 108.

Thus, the divider 108 divides outputs from the voltage controlled oscillator 105 in accordance with an output signal from the delta-sigma modulator 113 to implement fractional-N.

For example, when the delta-sigma modulator 113 uses the number of bits M and the phase comparison frequency corresponds to fcomp as mentioned above, channel steps equal fcomp×(F/(2 to the Mth power)).

The delta-sigma modulator may be supplied with an input signal representing a specific value (e.g., an exponential in binary). In this case, as shown in FIG. 7, there occurs a problem of generating a quantization noise as a spurious tone. In FIG. 7, the abscissa represents frequencies and the ordinate represents quantization noises.

Since the spurious tone occurs within a PLL's loop band, a loop filter, if used, cannot suppress the spurious tone. As a result, the wireless communication apparatus performance may be greatly affected.

In the past, spurious tones are prevented from occurring by increasing the number of bits for the delta-sigma modulator and, instead of suspected fractional part data F, using adjacent data (F−1 or F+1).

However, increasing the number of bits for the delta-sigma modulator enlarges the circuit scale. The output frequency slightly deviates from an intended frequency.

Japanese Published Unexamined Patent Application No. 3461799 (patent document 1) proposes the technology to be able to avoid a spurious tone in suspected fractional part data F. That is, there is provided the digital dither circuit that alternately selects two values F−k and F+k (where k is an integer) at a cycle half the comparison frequency.

FIG. 8 shows the schematic construction of a delta-sigma modulated fractional-N PLL frequency synthesizer having the digital dither circuit. The mutually corresponding parts in FIGS. 8 and 6 are designated by the same reference numerals and a detailed description is omitted for simplicity.

In FIG. 8, a digital dither circuit 112 is supplied with the above-mentioned fractional part data F from a register 111. The digital dither circuit 112 alternately selects two values F−k and F+k at a cycle half the comparison frequency and outputs the selected value to the delta-sigma modulator 13.

[Patent document 1] Japanese Published Unexamined Patent Application No. 3461799 (FIG. 1)

However, providing the digital dither circuit 112 as shown in FIG. 8 is unpreferable because the circuit scale is enlarged. Further, the digital dither circuit 112 is constructed to alternately output two values F−k and F+k that are used instead of suspected fractional part data F. When F+k is data to generate a spurious tone, for example, an operation is assumed to be problematic.

BRIEF SUMMARY OF THE INVENTION

The present invention addresses the foregoing problems by providing a delta-sigma modulated fractional-N PLL frequency synthesizer and a wireless communication apparatus capable of suppressing spurious tone generation without enlarging the circuit scale.

According to one embodiment of the present invention, a delta-sigma modulated fractional-N PLL frequency synthesizer performs fractional-N by modulating a divider to divide output frequencies of an oscillator and comprises: divided data holding means for holding divided data comprising integral part data and fractional part data; delta-sigma modulation means for integrating and quantizing an input data sequence; data sequence generation means for generating an artificially random data sequence averaging a value of the fractional part data out of an output data sequence from the delta-sigma modulation means and fractional part data and providing the generated data sequence as an input data sequence to the delta-sigma modulation means; and addition means for adding output from the delta-sigma modulation means to integral part data. In this case, output from the addition means modulates the divider.

According to another embodiment of the present invention, a wireless communication apparatus comprises: an antenna to transmit and receive wireless signals; transmitting and receiving means for converting frequencies of signals to be transmitted and received via the antenna into intended frequency signals using a local oscillation signal; and the delta-sigma modulated fractional-N PLL frequency synthesizer according to the present invention.

That is, the embodiment of the present invention generates an artificially random data sequence averaging a value of the fractional part data out of an output data sequence from the delta-sigma modulation means and fractional part data and provides the generated data sequence as an input data sequence to the delta-sigma modulation means. Accordingly, this greatly decreases the probability to take a suspected fractional part data value during operations of the delta-sigma modulation means. Further, data sequences input to the delta-sigma modulation means average a fractional part data value. Consequently, it is possible to accurately generate an intended frequency.

Since the present invention greatly decreases the probability to take a suspected fractional part data value during operations of the delta-sigma modulation means, it is possible to suppress generation of spurious tones. Further, the present invention generates an artificially random data sequence averaging a fractional part data value out of an output data sequence from the delta-sigma modulation means. This can be realized by using a small-scale construction such as an adder, a delay inverter, and the like, for example. There is no need to newly add a large circuit construction such as the related digital dither circuit. Therefore, it is possible to restrain the circuit scale from increasing.

Other and further objects, features and advantages of the invention will appear more fully from the following description.

BRIEF DESCRIPTION OF THE DRAWINGS

FIG. 8 is a block circuit diagram schematically showing the construction of a related delta-sigma modulated fractional-N PLL frequency synthesizer having a digital dither circuit.

DETAILED DESCRIPTION OF THE PREFERRED EMBODIMENT

Embodiments of the delta-sigma modulated fractional-N PLL frequency synthesizer and the wireless communication apparatus according to the present invention will be described in further detail with reference to the accompanying drawings. Of course, it is to be distinctly understood that the following-description provides only examples and the present invention is not limited thereto.

[Schematic Construction of the Cellular Phone]

Figure 1:
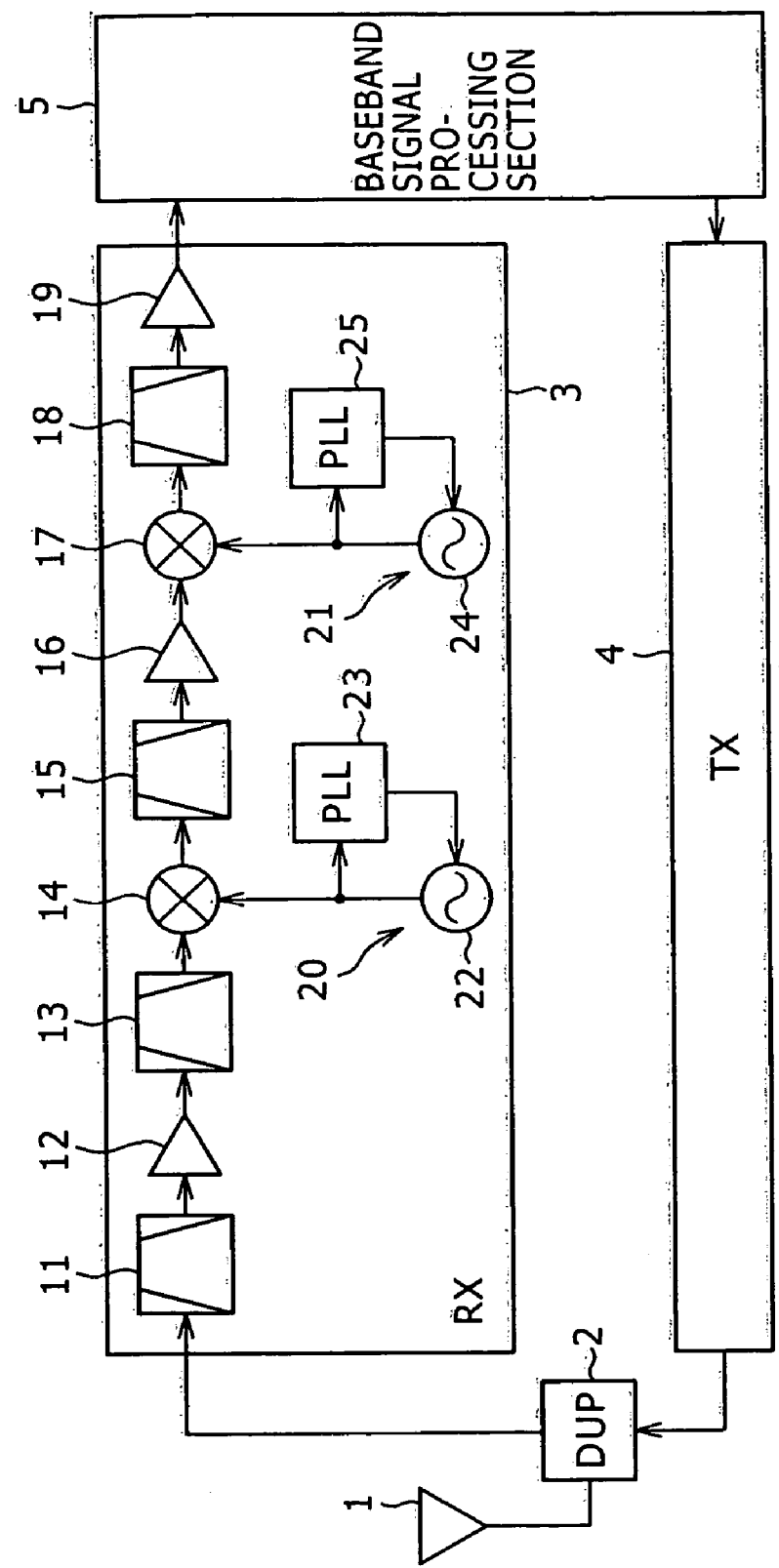
FIG. 1 is a block circuit diagram schematically showing the construction of a major part of a cellular phone as an embodiment of the wireless communication apparatus according to an embodiment of the present invention.

FIG. 1 schematically shows the construction of a major part of the cellular phone as an embodiment of the wireless communication apparatus according to the present invention. The description to follow only covers the detailed construction of a reception block (RX) 3. The present invention is applicable to not only the reception block 3, but also a transmission block (TX) 4. Like ordinary cellular phones, the cellular phone according to the embodiment is undoubtedly provided with the other constructions such as a CPU, memory, a speaker, a microphone, a key operation section, a display, and a power supply system although their illustrations and detailed descriptions are omitted.

In FIG. 1, a reception signal is received at an antenna 1, passes through a duplexer 2, and is transmitted to a reception block 3.

The reception block 3 is a heterodyne high-frequency block. The reception signal is transmitted to a high-frequency filter 11. The high-frequency filter 11 performs a filtering process to pass reception signals with a specified RF band. The filtered reception signal is amplified in a low noise amplifier (LNA) 12. The reception signal amplified in the low noise amplifier (LNA) 12 passes through an image elimination filter and is transmitted to a first mixer 14.

The first mixer 14 uses a first local oscillation signal supplied from a first local oscillation signal generating section 20 to convert an RF-band reception signal transmitted from the image elimination filter 13 into an intermediate frequency (IF). The reception signal, converted into the intermediate frequency, is filtered in the IF filter 15. The reception signal is then amplified to proper power in a variable gain amplifier 16 and is transmitted to a second mixer 17.

The second mixer 17 uses a second local oscillation signal supplied from a second local oscillation signal generating section 21 to convert an IF-band signal transmitted from the variable gain amplifier 16 into a baseband frequency. The reception signal converted into the baseband frequency is transmitted to a low-pass filter 18. The low-pass filter separates an intended channel's signal from the reception signal. The intended channel's signal is amplified in an output amplifier 19 and is transmitted to a baseband signal processing section 5.

The baseband signal processing section 5 performs reception signal demodulation, a despread process, a deinterleave process, an error correction process, an analog-digital conversion, and the like. The baseband signal processing section 5 outputs resulting reception data to a CPU and the like (not shown).

On the other hand, the baseband signal processing section 5 adds an error correction code, performs an interleave process, a spread process, a modulation process, and the like to generate a transmission signal. The generated transmission signal is forwarded to a transmission block 4.

The transmission block 4 performs processes to convert the transmission signal at the baseband frequency into the intermediate frequency, convert the transmission signal at the intermediate frequency into an RF band, amplify the transmission signal to specified transmission power, and the like. The transmission signal output from the transmission block 4 passes through the duplexer 2, is forwarded to the antenna 1, and is output from the antenna 1.

Schematic Construction of the Local Oscillation Signal Generating Sections According to the First Embodiment The cellular phone according to the embodiment has the first and second local oscillation signal generating sections 20 and 21. The first local oscillation signal generating section 20 includes an oscillator 22 and a PLL circuit 23. The second local oscillation signal generating section 21 includes an oscillator 24 and a PLL circuit 25. The oscillators and the PLL circuits use the delta-sigma modulated fractional-N PLL frequency synthesizer according to the first-embodiment as shown in FIG. 2.

Figure 2:
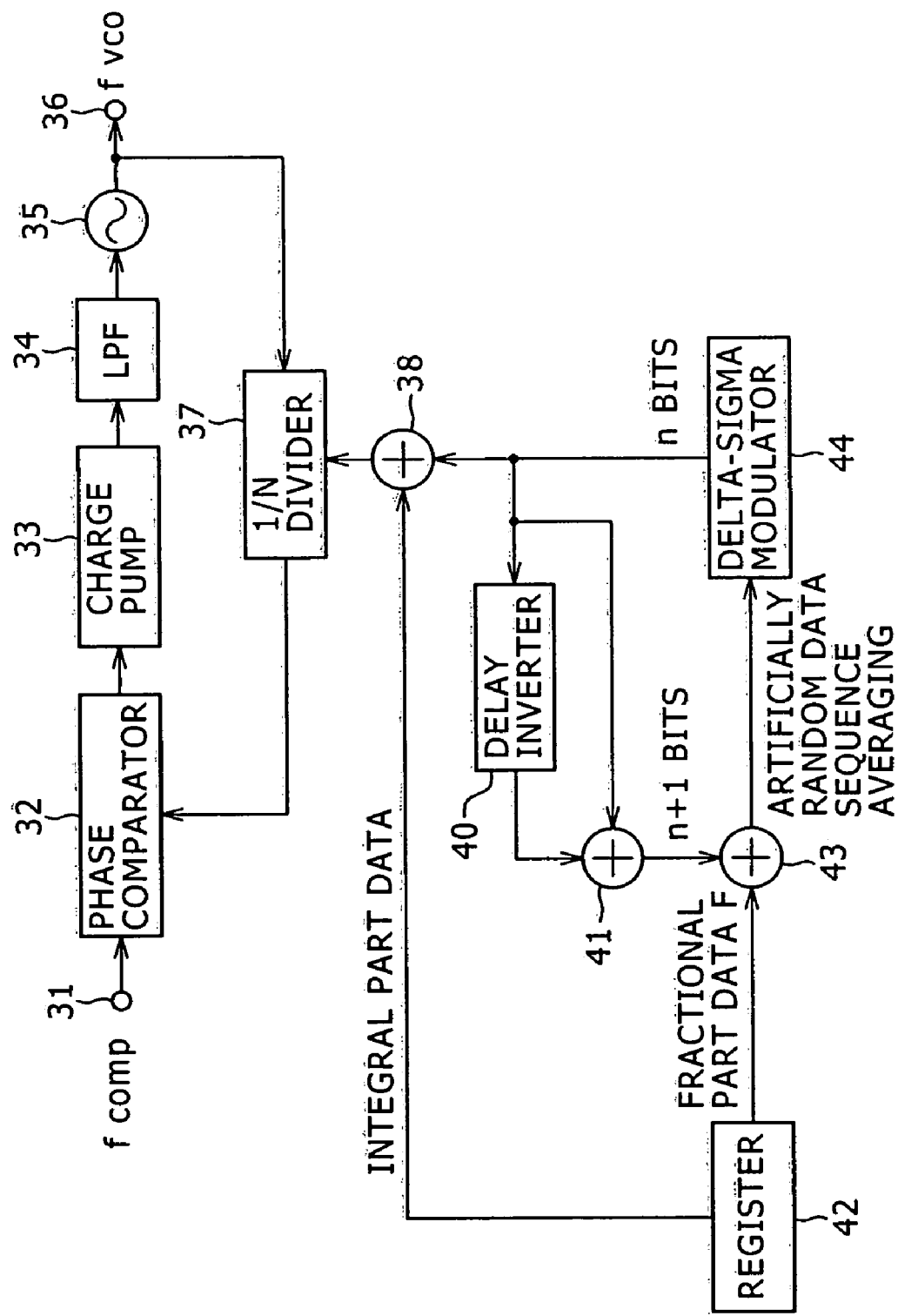
FIG. 2 is a block circuit diagram schematically showing the construction of a delta-sigma modulated fractional-N PLL frequency synthesizer according to a first embodiment of the present invention.

In FIG. 2, a terminal 31 is supplied with a phase comparison frequency fcomp signal generated by dividing the reference frequency signal from the reference oscillator (not shown). The phase comparison frequency fcomp signal is input to a phase comparator 32. The phase comparator 32 detects a phase difference between the phase comparison frequency fcomp signal supplied from the terminal 31 and a frequency signal generated from a divider 37 by dividing by N an output frequency from a voltage controlled oscillator (VCO) 35 equivalent to the oscillator 22 (or 24) in FIG. 1. The phase comparator 102 outputs a phase difference signal that represents the phase difference in binary. The phase difference signal output from the phase comparator 32 is transmitted to a charge pump 33.

The charge pump 33 converts the binary phase difference signal from the phase comparator 32 into ternary. The charge pump 33 supplies or is supplied with currents corresponding to the three values to generate current signals proportional to the above-mentioned phase difference. An output current signal from the charge pump 33 is transmitted to a low pass filter (LPF) 34.

The low pass filter 34 smoothes the output current signal from the charge pump 33 and converts it into a voltage signal. An output voltage signal from the low pass filter 34 is used for controlling a voltage controlled oscillator 35.

The voltage controlled oscillator 35 outputs a oscillation frequency fvco signal corresponding to the output voltage signal from the low pass filter 34. The oscillation frequency fvco signal works as an output signal from the delta-sigma modulated fractional-N PLL frequency synthesizer and is transmitted from a terminal 36 to the mixer 14 (or 17) in FIG. 1. Further, the oscillation frequency fvco signal is divided by the divider 37 up to the above-mentioned comparison frequency and is then fed back to the phase comparator 32.

A register 42 stores data representing integral parts and fractional parts of the divided data. The register 42 supplies an adder 38 (hereafter referred to as a third adder 38) with integral part data including a plurality of bits to represent the integral part. The register 111 supplies an adder 43 (a second adder according to the present invention, hereafter referred to as a second adder 43) with fractional part data F including a plurality of bits to represent the fractional part.

The second adder 43 adds the above-mentioned fractional part data F to output from an adder to be described (a first adder according to the present invention, hereafter referred to as a first adder 41). Data as an addition result is forwarded to a delta-sigma modulator 44.

The delta-sigma modulator 44 integrates and quantizes the supplied data. The delta-sigma modulator 44 outputs the processed data to the third adder 38, a delay inverter 40, and the first adder 41.

The third adder 38 adds the integral part data to output data from the delta-sigma modulator 44. The third adder 38 outputs addition result data as a signal to modulate the divider 37.

The delay inverter 40 delays output from the delta-sigma modulator 44 by one clock, inverts it, and then outputs it to the first adder 41.

The first adder 41 adds the output from the delta-sigma modulator 44 to the output from the delay inverter 40, and outputs addition result data to the second adder 43. According to the embodiment, the output bit width for the first adder 41 is equivalent to a bit width resulting from adding one bit to the output bit width for the delta-sigma modulator 44.

That is, assuming that the delta-sigma modulator 44 has the output bit width of n bits, the first adder 41 has the output bit width of (n+1) bits.

An average value of output data sequences (hereafter referred to as bit streams) from the delta-sigma modulator 44 equals a fractional value represented by F/(2 to the Mth power). When the delta-sigma modulator 44 is configured to output three bits, output values can be "−3, −2, −1, 0, 1, 2, 3, and 4" whose data sequence is artificially random. Therefore, when the delta-sigma modulator 44 outputs a bit stream which is then delayed, for example, it is possible to say that the delayed bit stream has little correlation with the original stream.

Let us consider addition between the original output bit stream and the delayed and inverted output bit stream from the delta-sigma modulator 44. A result is to generate artificially random bit streams that average "0." The artificially random bit stream can take up to an absolute value that doubles an output from the delta-sigma modulator 44. In the delta-sigma modulated fractional-N PLL frequency synthesizer according to the embodiment, the delay inverter 40 delays and inverts an output bit stream from the delta-sigma modulator 44. The first adder 41 adds that bit stream to an output bit stream from the delta-sigma modulator 44 to generate artificially random bit streams that average "0."

Further, adding fractional part data F to the artificially random bit streams averaging "0" yields artificially random data sequences that average fractional part data F. In the, delta-sigma modulated fractional-N PLL frequency synthesizer according to the embodiment, the second adder 43 adds the fractional part data F to artificially random bit streams averaging "0" to generate artificially random data sequences averaging the fractional part data F.

In the delta-sigma modulated fractional-N PLL frequency synthesizer according to the embodiment, the second adder 43 supplies the delta-sigma modulator 44 with artificially random data sequences averaging the fractional part data F.

This greatly decreases the probability to take suspected fractional part data F during operations of the delta-sigma modulator 44. As a result, generation of spurious tones decreases. According to the embodiment, data sequences supplied to the delta-sigma modulator 44 average the value of fractional part data F as mentioned above. Consequently, the delta-sigma modulated fractional-N PLL frequency synthesizer according to the embodiment can accurately generate an intended frequency.

Figure 3:
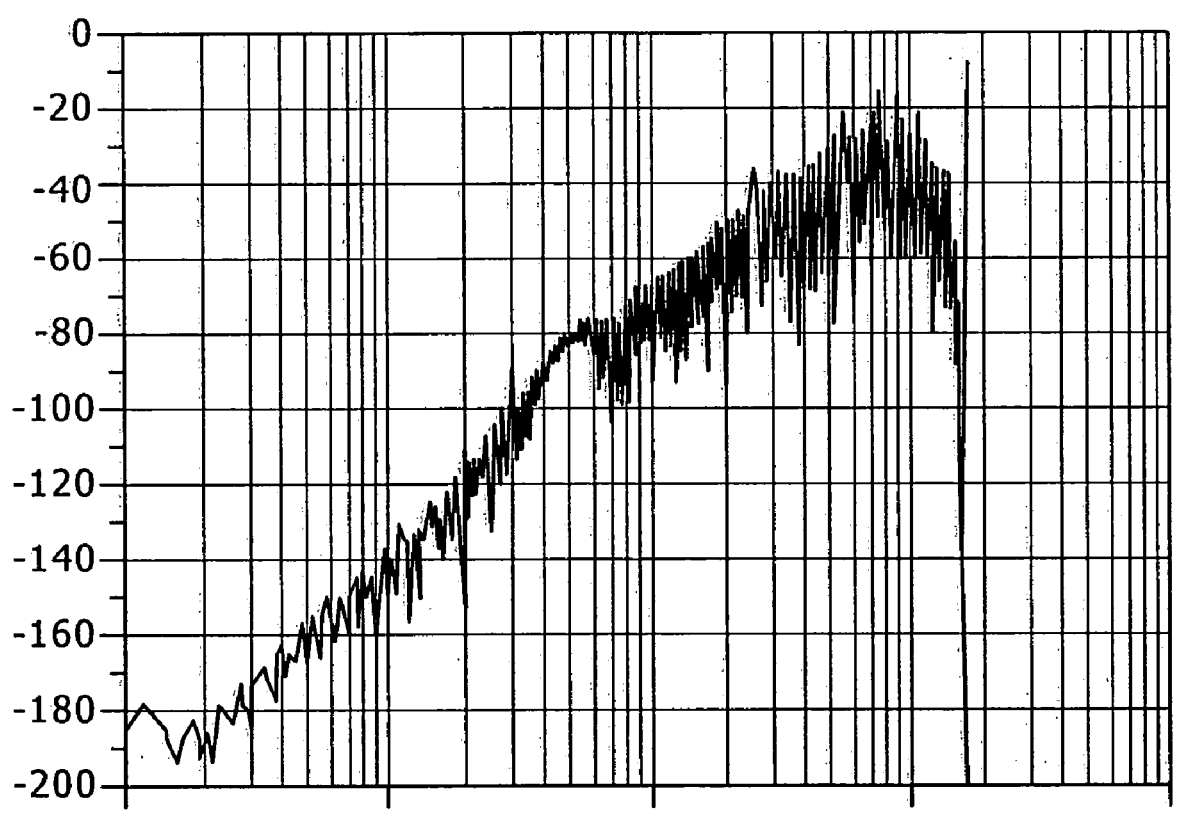
FIG. 3 is a characteristics diagram showing a result of simulating a quantization noise in a delta-sigma modulator according to the first embodiment.

FIG. 3 shows a result of simulating a quantization noise in the delta-sigma modulator according to the first embodiment. In FIG. 3, the abscissa represents frequencies and the ordinate represents quantization noises. The example in FIG. 3 clarifies that the embodiment suppresses generation of spurious tones even when the value of fractional part data F is an exponential in binary. This makes it possible to provide a spectrum approximate to the original noise shaping.

Figure 4:
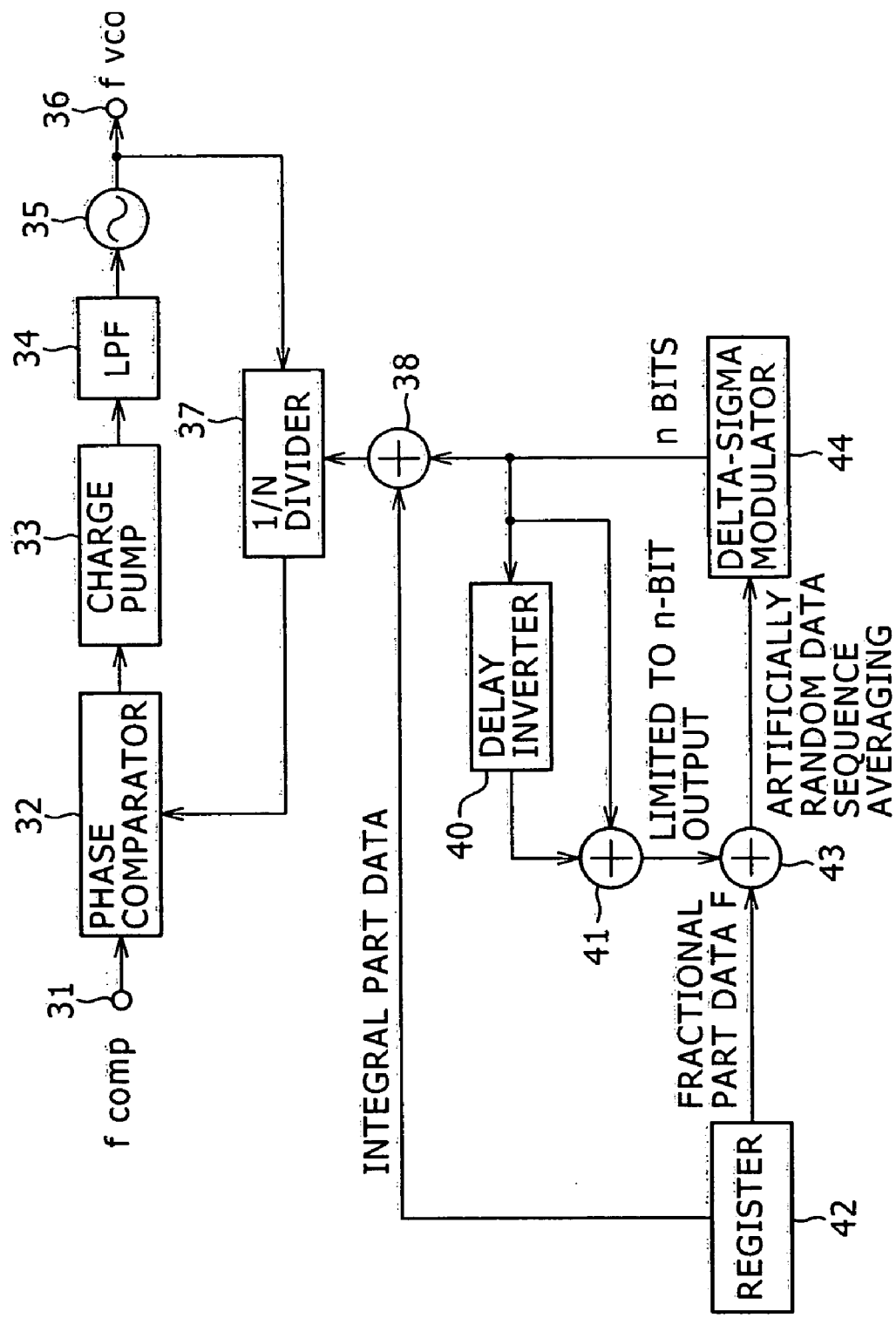
FIG. 4 is a block circuit diagram schematically showing the construction of a delta-sigma modulated fractional-N PLL frequency synthesizer according to a second embodiment of the present invention.

Schematic Construction of the Local Oscillation Signal Generating Section According to a Second Embodiment FIG. 4 schematically shows the construction of the delta-sigma modulated fractional-N PLL frequency synthesizer according to the second embodiment with respect to the first and second local oscillation signal generating sections in FIG. 1. The mutually corresponding parts in FIGS. 4 and 2 are designated by the same reference numerals and a detailed description is omitted for simplicity.

According to the second embodiment in FIG. 4, the output bit width for the first adder 41 equals that for the delta-sigma modulator 44. That is, assuming that the delta-sigma modulator 44 has the output bit width of n bits, the output bit width of the first adder 41 is limited to n bits.

Like the first embodiment, the delay inverter 40 delays and inverts an output bit stream from the delta-sigma modulator 44. The first adder 41 adds that bit stream to an output bit stream from the delta-sigma modulator 44 to generate artificially random bit streams that average "0." The output bit width for the first adder 41 is configured to equal that for the delta-sigma modulator 44. Accordingly, output from the first adder 41 becomes a data sequence that is clipped at a given value. As a result of the clipping, the average value slightly deviates from the value of fractional part data F, but not so greatly as F+1 according to the prior art as mentioned above.

Figure 5:
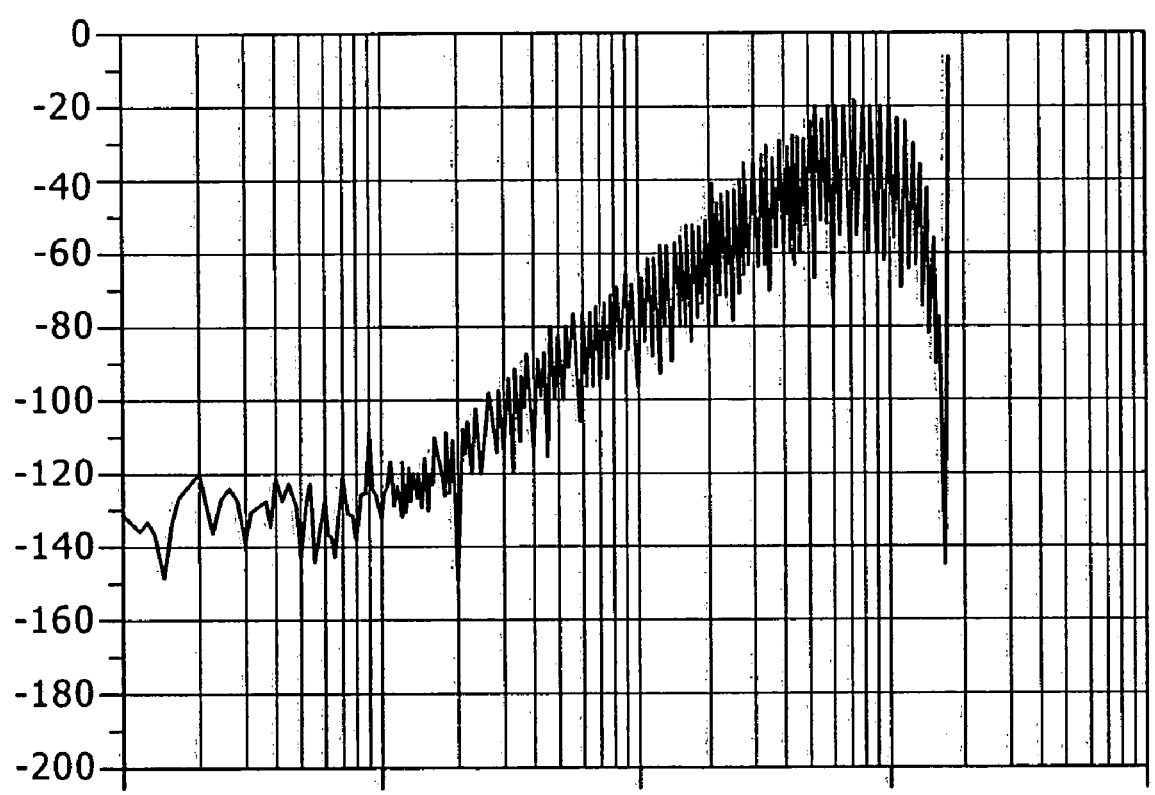
FIG. 5 is a characteristics diagram showing a result of simulating a quantization noise in a delta-sigma modulator according to the second embodiment.
Figure 6:
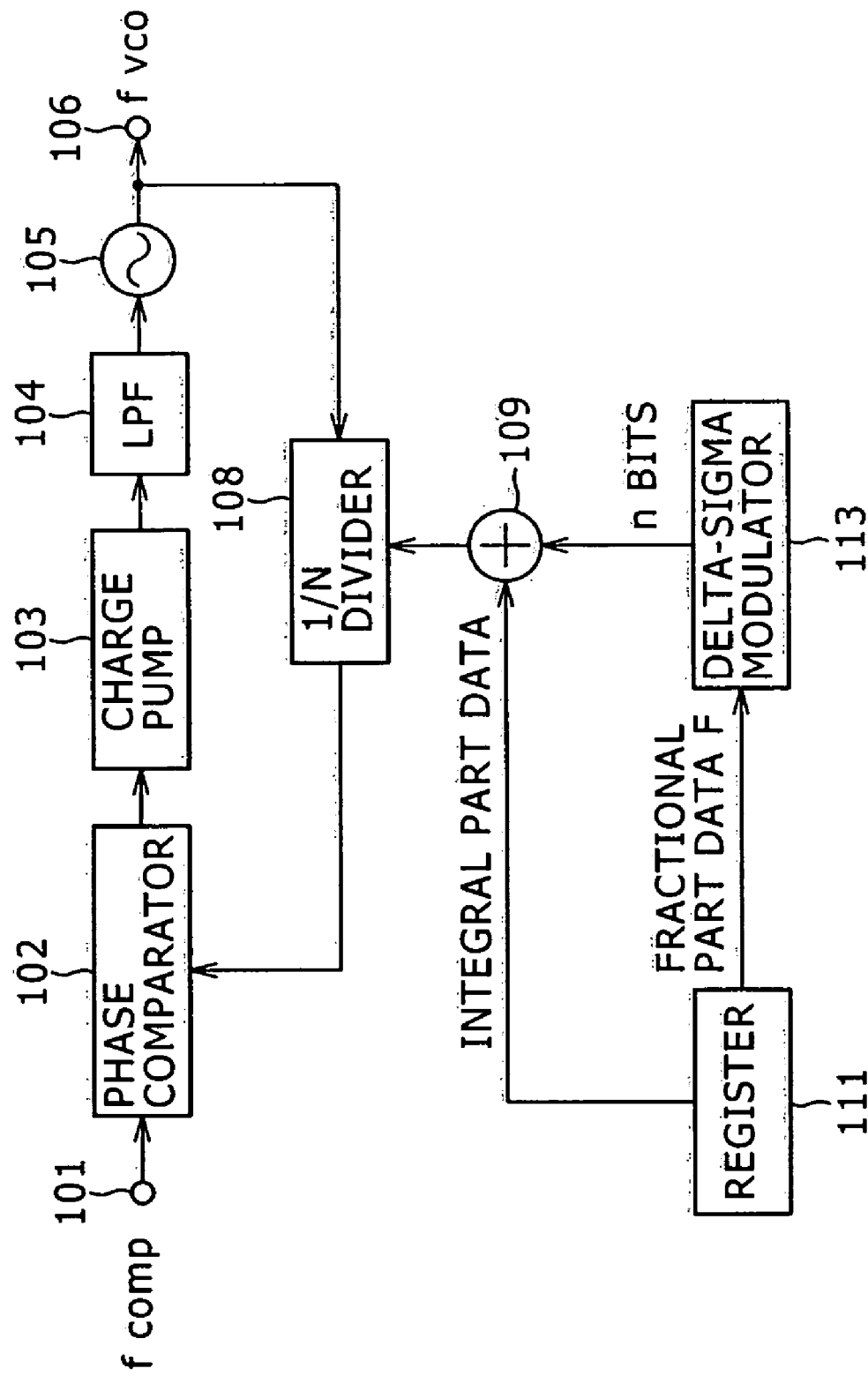
FIG. 6 is a block circuit diagram schematically showing the construction of a related delta-sigma modulated fractional-N PLL frequency synthesizer.
Figure 7:
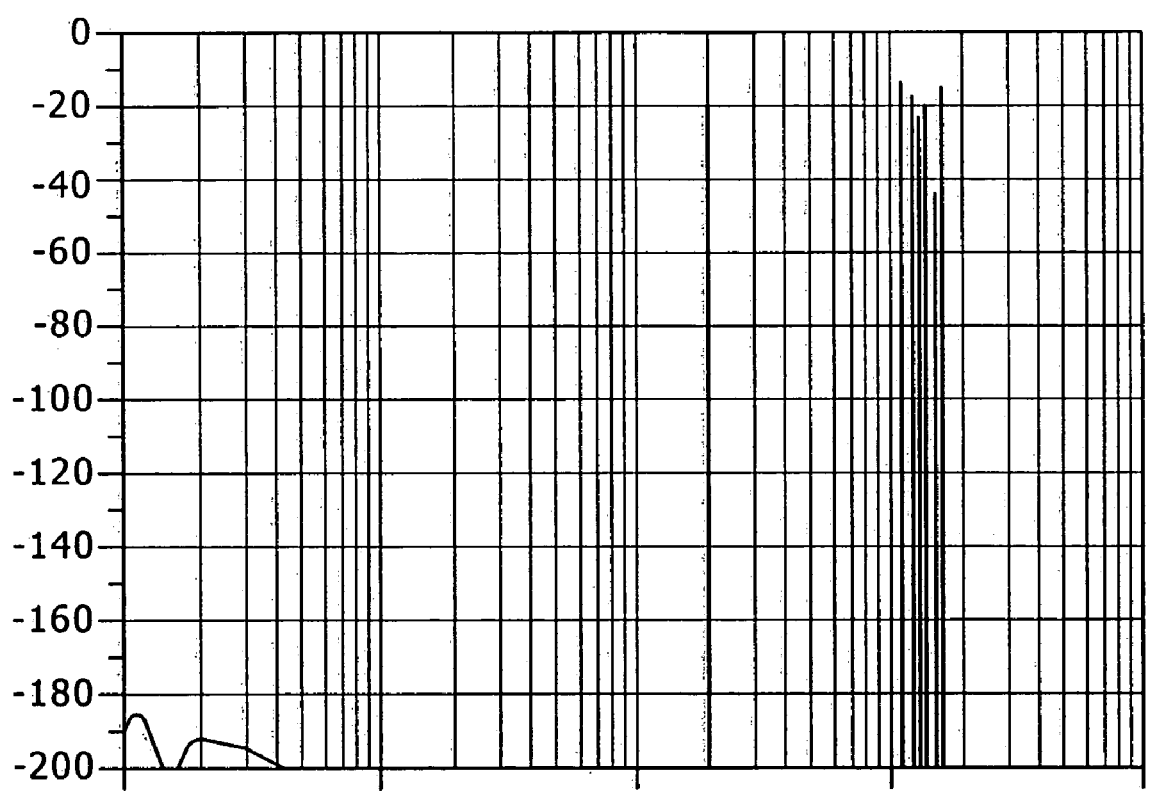
FIG. 7 is a characteristics diagram showing a result of simulating a quantization noise in the delta-sigma modulator in FIG. 6.

FIG. 5 shows a result of simulating a quantization noise in the delta-sigma modulator according to the second embodiment. In FIG. 5, the abscissa represents frequencies and the ordinate represents quantization noises. The example in FIG. 5 clarifies that the embodiment suppresses generation of spurious tones even when the value of fractional part data F is an exponential in binary. This makes it possible to provide a spectrum approximate to the original noise shaping. According to the second embodiment, the average value slightly deviates from the value of fractional part data F as mentioned above. The deviation is approximately 0.2 for the simulation result in FIG. 5 and can be considered to be practically allowable.

As mentioned above, the delta-sigma modulated fractional-N PLL frequency synthesizer and the cellular phone having the same according to the embodiments of the present invention can suppress spurious tone generation correspondingly to specific data configuration without increasing the number of bits for the delta-sigma modulator 44. The frequency generated from the frequency synthesizer hardly deviates from an intended frequency. The amount of deviation from the intended frequency, if any, is limited to a minimal. Further, the frequency synthesizer according to the embodiments can be realized by using small-scale hardware such as the delay inverter 40, the adders 41 and 43, and the like that use output signals from the delta-sigma modulator 44 itself. There is no need to provide a new additional block such as the related digital dither circuit.

The above-mentioned embodiments have described examples of the present invention. The present invention is not limited to the above-mentioned embodiments. Furthermore, the present invention may be embodied in various modifications according to designs and the like without departing from the technological spirit and scope of the invention.

For example, the wireless communication apparatus according to the present invention is applicable to not only cellular phones, but also any other apparatuses having communication capabilities.

It should be understood by those skilled in the art that various modifications, combinations, sub-combinations and alterations may occur depending on design requirements and other factors insofar as they are within the scope of the appended claims or the equivalents thereof.

What is claimed is:

1. A delta-sigma modulated fractional-N PLL frequency synthesizer to perform fractional-N by modulating a divider which divides output frequencies of an oscillator, said synthesizer comprising:
   divided data holding means for holding divided data comprising integral part data and fractional part data;
   delta-sigma modulation means for integrating and quantizing an input data sequence;

data sequence generation means for generating an artificially random data sequence averaging a value of said fractional part data out of an output data sequence from said delta-sigma modulation means and fractional part data supplied from said divided data holding means and providing the generated data sequence as an input data sequence to said delta-sigma modulation means; and addition means for adding output from said delta-sigma modulation means to integral part data supplied from said divided data holding means, wherein output from said addition means modulates the divider.

2. The delta-sigma modulated fractional-N PLL frequency synthesizer according to claim 1, wherein said data sequence generation means comprises:

a first data sequence generation section which generates an artificially random data sequence averaging zero out of an output data sequence from said delta-sigma modulation means; and a second data sequence generation section which adds a data sequence generated by said data sequence generation means to fractional part data supplied from said divided data holding means and generates an artificially random data sequence averaging the value of fractional part data.

3. The delta-sigma modulated fractional-N PLL frequency synthesizer according to claim 2, wherein said first data sequence generation section adds an output data sequence from said delta-sigma modulation means to a data sequence resulting from delaying an output data sequence from said delta-sigma modulation means for at least one clock and inverting the output data sequence to generate an artificially random data sequence averaging the value of fractional part data.

4. The delta-sigma modulated fractional-N PLL frequency synthesizer according to claim 2, wherein said first data sequence generation section has a delay inverter to delay an output data sequence from said delta-sigma modulation means for at least one clock and to invert the output data sequence and a first adder to an output data sequence from said delta-sigma modulation means to output from said delay inverter; and wherein said second data sequence generation means has a second adder to add output from said first adder to fractional part data supplied from said divided data holding means and to output a result to delta-sigma modulation means.

5. The delta-sigma modulated fractional-N PLL frequency synthesizer according to claim 4, wherein said first adder has an output bit width equivalent to one bit plus an output bit width of said delta-sigma modulation means.

6. The delta-sigma modulated fractional-N PLL frequency synthesizer according to claim 4, wherein said first adder has an output bit width equal to an output bit width of delta-sigma modulation means.

7. A delta-sigma modulated fractional-N PLL frequency synthesizer to perform fractional-N by modulating a divider which divides output frequencies of an oscillator, said synthesizer comprising:

a register to hold divided data comprising integral part data and fractional part data;

a delta-sigma modulator to integrate and quantize an input data sequence;

a first data sequence generation section to generate an artificially random data sequence averaging zero from an output data sequence from said delta-sigma modulation means;

a second data sequence generation section which adds a data sequence generated by said first data sequence generation section to fractional part data supplied from said register and generates an artificially random data sequence-averaging the value of fractional part data; and an adder to add output from said delta-sigma modulator to integral part data supplied from said register, wherein output from said adder modulates said divider.

8. A wireless communication apparatus comprising:

an antenna to transmit and receive wireless signals;

a transmitting and receiving circuit to convert frequencies of signals to be transmitted and received via said antenna into intended frequency signals using a local oscillation signal;

an oscillator to generate a local oscillation signal to be supplied to said transmitting and receiving circuit;

a divider to divide an output frequency from said oscillation means;

an oscillation frequency control circuit to control said oscillator's oscillation frequency corresponding to a difference between said divider's output and a reference frequency;

a register to hold divided data having integral part data and fractional part data;

a delta-sigma modulator to integrate and quantize an input data sequence;

data sequence generation means for generating an artificially random data sequence averaging a value of the fractional part data out of an output data sequence from said delta-sigma modulator and fractional part data supplied from said register and providing the generated data sequence as an input data sequence to said delta-sigma modulator;

an adder to add output from said delta-sigma modulator to integral part data supplied from said register; and a delta-sigma modulated fractional-N PLL frequency synthesizer to modulate said divider using output from said adder.

* * * * *